United States Patent
Cheng et al.

(10) Patent No.: US 7,279,120 B2
(45) Date of Patent: Oct. 9, 2007

(54) DOPED CADMIUM TUNGSTATE SCINTILLATOR WITH IMPROVED RADIATION HARDNESS

(75) Inventors: Shifan Cheng, Moraga, CA (US); Yi-Qun Li, Walnut Creek, CA (US)

(73) Assignee: Intematix Corporation, Fremont, CA (US)

( * ) Notice: Subject to any disclaimer, the term of this patent is extended or adjusted under 35 U.S.C. 154(b) by 178 days.

(21) Appl. No.: 10/928,755

(22) Filed: Aug. 27, 2004

(65) Prior Publication Data

US 2006/0043335 A1    Mar. 2, 2006

Related U.S. Application Data

(60) Provisional application No. 60/500,917, filed on Sep. 4, 2003.

(51) Int. Cl.
C09K 11/68 (2006.01)

(52) U.S. Cl. .................. 252/301.5; 378/4; 378/98.8; 378/98.12; 250/362; 250/367; 250/475.2; 250/483.1; 250/370.09

(58) Field of Classification Search ............ 252/301.5, 252/301.6 R; 378/4, 98.8, 98.12; 250/362, 250/367, 475.2, 483.1, 370.09
See application file for complete search history.

(56) References Cited

U.S. PATENT DOCUMENTS

| | | | |
|---|---|---|---|
| 2,361,467 A * | 10/1944 | Fernberger | 252/301.5 |
| 3,668,143 A * | 6/1972 | Luckey | 252/301.4 R |
| 4,115,312 A * | 9/1978 | Engel et al. | 252/301.5 |
| 4,230,510 A | 10/1980 | Cuasno et al. | |
| 4,242,221 A | 12/1980 | Cuasno et al. | |
| 4,362,946 A | 12/1982 | Cuasno et al. | |
| 4,421,671 A | 12/1983 | Cuasno et al. | |
| 4,466,929 A | 8/1984 | Greskovich et al. | |
| 4,466,930 A | 8/1984 | Greskovich et al. | |
| 4,473,513 A | 9/1984 | Cuasno et al. | |
| 4,518,545 A | 5/1985 | Cuasno et al. | |
| 4,518,546 A | 5/1985 | Greskovich et al. | |
| 4,571,312 A | 2/1986 | Greskovich et al. | |
| 4,747,973 A | 5/1988 | Cusano et al. | |
| 4,799,094 A | 1/1989 | Rougeot et al. | |
| 4,883,956 A | 11/1989 | Melcher et al. | |
| 4,933,562 A | 6/1990 | Roziere | |
| 5,057,692 A | 10/1991 | Greskovich et al. | |
| 5,166,073 A | 11/1992 | Lefkowitz et al. | |
| 5,245,648 A | 9/1993 | Kinney et al. | |
| 5,306,907 A | 4/1994 | Nudelman et al. | |
| 5,318,722 A | 6/1994 | Tsoukala et al. | |
| 5,360,557 A | 11/1994 | Tsoukala et al. | |
| 5,391,876 A | 2/1995 | Tsoukala et al. | |
| 5,434,418 A | 7/1995 | Schick | |
| 5,484,750 A | 1/1996 | Greskovich et al. | |
| 5,510,644 A | 4/1996 | Harris et al. | |
| 5,587,611 A | 12/1996 | Botka et al. | |
| 5,640,017 A | 6/1997 | Thevenin | |
| 5,650,626 A | 7/1997 | Trauernicht et al. | |
| 5,753,921 A | 5/1998 | Trauernicht et al. | |
| 5,834,782 A | 11/1998 | Schick et al. | |
| 5,838,759 A | 11/1998 | Armistead | |
| 5,864,146 A | 1/1999 | Karellas et al. | |
| 5,898,753 A | 4/1999 | Schick et al. | |
| 5,912,942 A | 6/1999 | Schick et al. | |
| 6,087,618 A | 7/2000 | Wiener-Avnear et al. | |
| 6,093,347 A | 7/2000 | Lynch et al. | |
| 6,194,726 B1 | 2/2001 | Pi et al. | |
| 6,358,441 B2 | 3/2002 | Duclos et al. | |
| 6,496,250 B1 | 12/2002 | Duclos et al. | |
| 6,504,156 B1 | 1/2003 | Takahara et al. | |
| 6,553,092 B1 | 4/2003 | Mattson et al. | |
| 6,563,121 B1 | 5/2003 | Schreiner et al. | |
| 6,717,174 B2 | 4/2004 | Karellas | |
| 6,774,556 B2 | 8/2004 | Srivastava et al. | |

FOREIGN PATENT DOCUMENTS

EP             795631         * 9/1997

OTHER PUBLICATIONS

Tanaka,K. "cathode luminescence of samarium, europium, and gadolinium ion doped scintillator CdWO4 single crystals studied with x-ray photoelectron spectroscpoy", Journ. App. Phys. vol. 89, No. 10, May 15, 2001, pp. 5449-5453.*

* cited by examiner

*Primary Examiner*—C. Melissa Koslow
(74) *Attorney, Agent, or Firm*—Quine Intellectual Property Law Group, P.C.; Gary Baker

(57) ABSTRACT

This invention provides novel cadmium tungstate scintillator materials that show improved radiation hardness. In particular, it was discovered that doping of cadmium tungstate ($CdWO_4$) with trivalent metal ions or monovalent metal ions is particularly effective in improving radiation hardness of the scintillator material.

20 Claims, 3 Drawing Sheets

US 7,279,120 B2

DOPED CADMIUM TUNGSTATE SCINTILLATOR WITH IMPROVED RADIATION HARDNESS

CROSS-REFERENCE TO RELATED APPLICATIONS

This application claims benefit of and priority to provisional application Ser. No. 60/500,917, filed on Sep. 4, 2003.

STATEMENT AS TO RIGHTS TO INVENTIONS MADE UNDER FEDERALLY SPONSORED RESEARCH AND DEVELOPMENT

[Not Applicable]

FIELD OF THE INVENTION

This invention provides new compositions and processing method for making doped cadmium tungstate scintillator materials that have a higher radiation hardness than that of undoped cadmium tungstate under UV, X-ray and other high-energy irradiation. The scintillator materials of this invention can be used in a variety of applications including, but not limited to X-ray detectors, e.g., for X-ray CT, digital panel imaging, screen intensifier etc. The scintillator materials of the invention can be used in bulk, sheet and film forms of ceramics, single crystals, glasses, and composites.

BACKGROUND OF THE INVENTION

A scintillator is a material, typically a crystal that responds to incident radiation by emitting light (e.g., a light pulse). Scintillators and compositions fabricated from scintillator materials are widely used in detectors for gamma-ray, X-rays, cosmic rays, and particles whose energy is of the order of 1 keV and greater. Often scintillators are used in X-ray imaging detectors for medical diagnostics, security inspection, industrial non-destructive evaluation (NDE), dosimetry, and high-energy physics. Using scintillator materials, it is possible to manufacture detectors in which the light emitted by the scintillator is coupled to a light-detection means and produces an electrical signal proportional to the amount of light received and to intensity of the incident radiation.

To acquire high resolution and quality picture, high dose radiation is required. Unfortunately, high dose radiation generally causes radiation damage to the scintillator material (i.e., the transmittance of scintillator crystal decreases with time), which inevitably leads to the loss of resolution and performance. One approach to solving this problem has been to lower the radiation dose. This approach requires better scintillators that provide higher light output to maintain the detector resolution and quality.

Recently, there has been an increasing demand for transparent, high atomic density, high speed and high light-output scintillator crystals and ceramic materials as detectors for computed X-ray tomography (CT) and other real time X-ray imaging systems. Many transparent ceramics like $(Y,Gd)_2O_3$:$Eu^{3+}$, $Gd_2O_2S$:Pr,F,Ce, etc. have been developed for this purpose. Their slow response, however, and lack of single crystal form have limited their applications for X-ray explosive detection systems and X-ray panel displays.

Another approach to providing improved scintillator materials has been to improve the radiation hardness of the scintillator crystals so they can withstand high dose radiation. Scintillators typically used for x-ray explosive detection systems are mainly CsI and $CdWO_4$ single crystals. Even though CsI provides a higher light output, its use has been problematic due to slow scan speeds associated with afterglow problems and low density for CsI, $CdWO_4$ crystals are more popular for X-ray explosive detection. $CdWO_4$ possesses shorter afterglow times and demonstrates lower radiation damage than CsI. Unfortunately, the radiation damage of $CdWO_4$ crystal also depends on the radiation dose. The higher the dose, the greater the radiation damage. For example, the radiation damage of CdWO4 crystal can reach as high as 40% when radiation dose is high enough.

Various approaches have been taken to reduce the radiation damage of tungstates. One approach has involved doping the scintillator material with other elements. Thus, for example, U.S. Patent Publication US 2003/0020044 A1, describes scintillator compositions formed from alkali and rare-earth tungstates, that have a general formula of $AD(WO_4)_n$. The composition $CsY_{0.25}Gd_{0.75}W_2O_8$ doped with Ca, showed improved radiation tolerance.

Another approach to improving radiation tolerance of scintillators has involved annealing the scintillator crystal in a controlled atmosphere. For example, the damage mechanism of $PbWO_4$ has been analyzed, and it was found the damage was caused by oxygen vacancies. By annealing the $PbWO_4$ crystal in an oxygen atmosphere, the defects in the crystal structure decreased significantly and the resistance to radiation damage improved.

SUMMARY OF THE INVENTION

This invention pertains to the use of doping to improve the radiation resistance of $CdWO_4$. It was a discovery of the present invention that doping provides a better method of increasing radiation hardness (e.g., as compared to annealing) as the doping can stabilize the scintillator crystal structure in air, which is convenient for material preparation. Moreover the doping does not substantially interfere with the light output and other desirable properties of the material.

In particular, it was discovered that doping of cadmium tungstate ($CdWO_4$) with trivalent metal ions or monovalent metal ions is particularly effective in improving radiation hardness of the scintillator material.

Thus, in one embodiment this invention provides a scintillator composition comprising a cadmium tungstate doped with a monovalent metal ion and/or a trivalent metal ion, wherein said scintillator composition shows higher radiation tolerance that undoped $CdWO_4$. In certain embodiments, the doped cadmium tungstate is represented by the formula: $Cd_{(1-(x+y))}A_xB_yWO_4$, where A is a monovalent metal ion selected from the group consisting of Li, Na, K, Rb, Cs, Ag, Tl, and combinations thereof; B is a trivalent metal ion selected from the group consisting of Bi, Y, La, Ce, Pr, Nd, Gd, Pm, Sm, Eu, Tb, Dy, Ho, Er, Tm, Yb, Lu, and combinations thereof; X ranges from 0 to about 0.01; Y ranges from 0 to about 0.01; and at least one of X or Y is non-zero. In certain embodiments, x is about 0.0002, 0.0005, 0.0008, 0.001, 0.003, 0.005, or 0.01 and y is optionally zero or greater than zero (e.g., 0.0002, 0.0005, 0.0008, 0.001, 0.003, 0.005, or 0.01). In certain embodiments, y is about 0.0002, 0.0005, 0.0008, 0.001, 0.003, 0.005, or 0.01 and x is optionally zero or greater than zero (e.g., 0.0002, 0.0005, 0.0008, 0.001, 0.003, 0.005, or 0.01). In certain embodiments, B is $Gd^{3+}$ or $Bi^{3+}$ and y is zero or ranges from about 0.0002 to about 0.001. In certain embodiments, x and y are both greater than zero. In certain embodiments, $K^{1+}$ or $Rb^{1+}$ and B is $Bi^{3+}$ and x and y are both greater than zero. In certain embodiments, the doped cadmium tungstate is selected from the group consisting of $Cd_{0.9995}Na_{0.0005}WO_4$, $Cd_{0.9995}Gd_{0.0005}WO_4$, and $Cd_{0.999}(KBi)_{0.001}WO_4$.

In various embodiments this invention also provides a detector element for an x-ray detector (e.g. an element of an x-ray CT scanner). The detector element typically comprises a scintillator as described herein and, optionally, a photodetector (e.g., photodiode, photomultiplier, film, optical guide, etc.).

Also provided is a method of making a scintillator composition. The method typically involves combining essentially equal amounts of CdO and $WO_3$ and minor amounts of a dopant that comprises at least one oxygen-containing compound of a monovalent metal selected from the group consisting of Li, Na, K, Rb, Cs, Ag and TL, or/and at least one oxygen containing compound of a trivalent element selected from the group consisting of Bi, Y, La, Ce, Pr, Nd, Gd, Pm, Sm, Eu, Tb, Dy, Ho, Er, Tm and Yb, where the dopant(s) comprise less than about 0.1 mole percent of the amount of cadmium; and firing the mixture at a temperature and for a time sufficient to convert the mixture to a solid solution of cadmium tungstate. Another method of making a scintillator composition comprises preparing a solution of a cadmium compound, a tungsten compound, and an amount of a monovalent metal ion selected from the group consisting of Li, Na, K, Rb, Cs, Ag, T, and/or a trivalent metal ion selected from the group consisting of Bi, Y, La, Ce, Pr, Nd, Gd, Pm, Sm, Eu, Tb, Dy, Ho, Er, Tm, Yb, Lu, where the monovalent ion and the trivalent ion when present are less than about 0.1 mole percent of the amount of cadmium; precipitating the compounds in a basic solution to obtain a mixture of oxygen-containing compounds; calcining the precipitate in an oxidizing atmosphere; and heating the precipitate at a temperature and for a time sufficient to convert the mixture to a solid solution of cadmium tungstate.

Also provided is an optical fiber comprising a scintillator composition of this invention where the optical fiber is optically coupled to the scintillator composition.

In still another embodiment this invention provides a method of producing an X-ray image. The method typically involves providing an x-ray detector comprising a scintillator composition as described herein, subjecting the scintillator composition to X-ray radiation; and detecting light emission from the scintillator composition.

BRIEF DESCRIPTION OF THE DRAWINGS

FIG. 3 schematically illustrates an x-ray detector system according to an embodiment of this invention. The system can be used for a variety of purposes including, but not limited to medical diagnostics, airport scanning, explosive detection, and the like.

DETAILED DESCRIPTION

Figure 1:
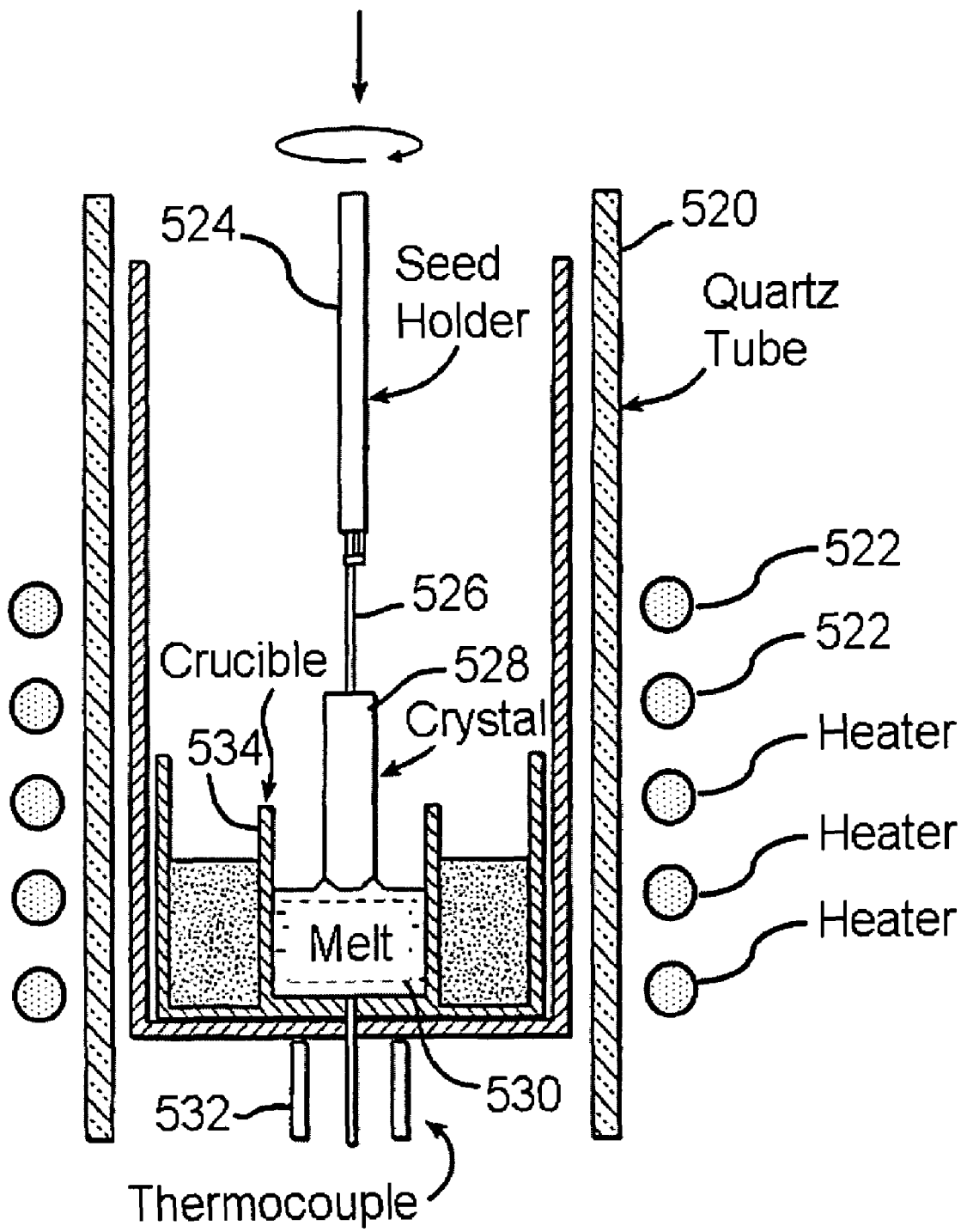
FIG. 1 schematically illustrates the Czochralski method for synthesizing a scintillator material of this invention.

This invention provides novel improved cadmium tungstate scintillator materials that show increased resistance to radiation damage. In certain embodiments, the scintillator materials of this invention comprise a cadmium tungstate doped with a monovalent metal ion and/or a trivalent metal ion, such that the scintillator composition shows higher radiation tolerance that undoped $CdWO_4$.

In various embodiments the doped cadmium tungstate is represented by the formula:

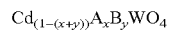

$$Cd_{(1-(x+y))}A_xB_yWO_4 \quad\quad\quad I.$$

where A is a monovalent metal ion selected from the group consisting of Li, Na, K, Rb, Cs, Ag, Tl, and combinations thereof; B is a trivalent metal ion selected from the group consisting of Bi, Y, La, Ce, Pr, Nd, Gd, Pm, Sm, Eu, Tb, Dy, Ho, Er, Tm, Yb, Lu, and combinations thereof; X typically ranges from 0 to about 0.01; Y typically ranges from 0 to about 0.01; and at least one of X or Y is non-zero. In certain embodiments, the cadmium tungstate is doped only with a monovalent metal ion (i.e., x is zero), in other embodiments, the cadmium tungstate is doped only with a trivalent metal ion (i.e., y is zero), and in certain embodiment, the cadmium tungstate is doped with both a monovalent metal ion and a trivalent metal ion. In certain embodiments, x and/or y are about or range up to about 0.008, 0.006, 0.004, 0.002, or 0.001. In certain embodiments, x and/or y are about, or range up to about 0.005.

The doped cadmium tungstate scintillator materials of this invention can be prepared according to a number of methods including, but not limited to the Bridgeman-Stockbarger method, conventional ceramic processes, a gelation/coprecipitation method, or a single crystal growth method such as the Czochralski method.

In a conventional ceramic process, essentially equal amounts of CdO and $WO_3$ are combined, and to this combination is added the desired amount of the desired dopant(s), e.g., oxygen-containing compounds of at least one trivalent element selected from the group consisting of Bi, Y, La, Ce, Pr, Nd, Gd, Pm, Sm, Eu, Tb, Dy, Ho, Er, Tm and Yb (e.g. $Bi_2O_3$, $Y_2O_3$, $La_2O_3$, $Ce_2O_3$, $Pr_2O_3$, $Nd_2O_3$, $Gd_2O_3$, $Pm_2O_3$, $Sm_2O_3$, $Eu_2O_3$, $Tb_2O_3$, $Dy_2O_3$, $Ho_2O_3$, $Er_2O_3$, $Tm_2O_3$, $Yb_2O_3$, and the like), or/and at least one oxygen-containing compound of at least one monovalent metal selected from the group consisting of Li, Na, K, Rb, Cs, Ag and Tl (e.g., $Li_2O$, $Na_2O$, $K_2O$, $Rb_2O$, $Cs_2O$, $Ag_2O$, $Tl_2O$, and the like). In certain embodiments, the compounds with are wet-mixed together with ethanol alcohol to form a slurry. The slurry is dried, e.g., at 100° C. for 2 hours. The mixture is then fired at temperature and for a time sufficient to convert the mixture to a solid solution of cadmium tungstate (e.g. at a temperature from 900° C. to 1100° C., for several hours).

In a gelation/coprecipitation process, a solution comprising a compound of Cd, a compound of tungsten, and the desired dopant(s), e.g., at least one trivalent element selected from the group consisting of Bi, Y, La, Ce, Pr, Nd, Gd, Pm, Sm, Eu, Tb, Dy, Ho, Er, Tm and Yb, or/and at least one monovalent metal selected from the group consisting of Li, Na, K, Rb, Cs, Ag and Tl is prepared with dilute $HNO_3$ solvent, and then gelatinized by adding ammonia to the solution to obtain a gel of oxygen-containing compounds. The gel is dried, e.g., at 100° C. for 3 hours and then calcined, e.g., at 700° C. for 1 hour in an oxidizing atmosphere. The calcined sample is fired at a temperature ranging from 900° C. to 1200° C. and for a time sufficient to convert the mixture to a solid solution of cadmium tungstate.

The single crystal growth process for producing a scintillator composition include, but are not limited to, the Bridgeman-Stockbarger method and the Czochralski method. A schematic of the Czochralski crystal growth method is illustrated in FIG. 1.

Typically, seed crystal of $CdWO_4$ is introduced into a saturated solution containing appropriate compounds and new crystalline material is allowed to grow and add to the seed crystal using Czochralski method.

The starting materials, typically comprising a cadmium compound, a tungsten compound and one or more of the dopant materials described herein are placed in a crucible 534 and heated to form a reactant melt 530. The crucible is typically located in a housing, such as a quartz tube 520, and heated, e.g. by r.f. or resistance heaters 522. The melt temperature is determined by a thermocouple 532. A single crystal seed 526 (e.g., a $CdWO_4$ seed crystal) attached to a seed holder 524 is lowered into the melt (the melt is the high temperature zone). As the seed 526 is rotated about its axis and lifted from the melt 530, a single crystal scintillator boule 528 forms below the seed. The size of the crystal boule 528 increases as the seed 526 is lifted further away from the melt 530 toward the low temperature zone above the heaters 522. The boule can then be sliced and polished into scintillator crystals.

The scintillator compositions of this invention can be used in many different applications. For example, the materials can be used as phosphors in lamps, in cathode ray tubes, in plasma display devices, or in a liquid crystal display. The material may also be used as scintillators in electromagnetic calorimeters, in gamma ray cameras, in computer tomography scanners, in x-ray detectors, in image intensifiers, in a lasers, and the like. These uses are meant to be merely illustrative and not exhaustive.

In certain preferred embodiments, the tungstate scintillator materials of this invention are fabricated to form sintered bodies that can then be incorporated into any of a number of devices. Methods of forming scintillator materials into sintered bodies are well known to those of skill in the art (see, e.g., U.S. Pat. Nos. 6,740,262, 5,013,696, 6,458,295, 6,384,417, and the like).

Thus, for example, in one approach, a powdered scintillator materials of this invention can be subjected to a cold isostatic pressing, e.g., under a pressure of about 200 MPa and then shaped. The resulting cold pressed material can be covered, e.g., with molybdenum foil, and charged into a capsule, e.g. a cylindrical capsule of tantalum for hot isostatic pressing. After the internal air is exhausted from the capsule the airtight capsule is completely sealed, e.g. by electron beam welding. Thereafter, the airtight vessel is subjected to a hot isostatic pressing (HIP), e.g., under the conditions of 1000° C. to 1500° C. and 150 MPa in an inert atmosphere, e.g., argon. After this is cooled, the resulting sintered ingot can be removed the metal container and, optionally, cut or machined into the desired shape. Finally the surface of the resulting material scintillator can be polished, e.g., with the abrasive powder of silicon carbide GC2000.

The scintillator materials of this invention can be incorporated into any of a number of devices such as gamma ray cameras/detectors, computer tomography scanners, x-ray detectors, image intensifiers, and the like using methods well known to those of skill in the art (see, e.g., U.S. Pat. Nos. 6,458,295, 6,384,417, 6,340,436, 5,558,815, and the like).

Figure 2:
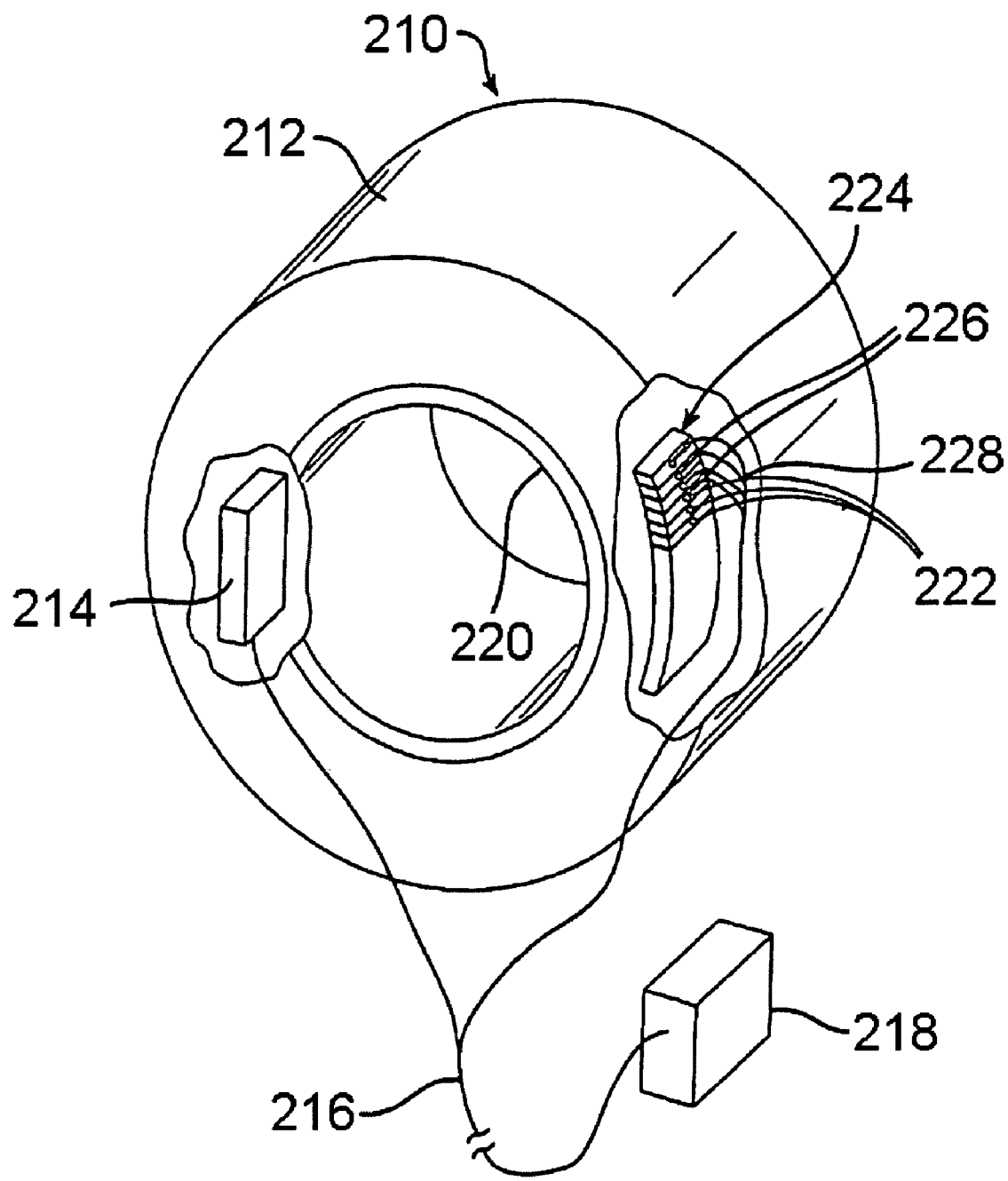
FIG. 2 schematically illustrates a portion of a CT machine comprising a scintillator material according to an embodiment of this invention.

By way of illustration, FIG. 2 schematically illustrates a computer tomography (CT) scanning system 210 utilizing a scintillator according to this invention. In certain embodiments, this scanning system 210 comprises a cylindrical enclosure 220 in which the patient or object to be scanned is placed. A support 212 typically surrounds the cylinder 220 and is configured for partial or full rotation about the cylinder's axis. The support 212 can be designed to revolve for one full revolution and then return or it can be designed for continuous rotation, depending on the system used to connect the electronics on the support to the rest of the system. Typically, the support includes an x-ray source 214 that, in certain embodiments produces a fan-shaped x-ray beam that encompasses a scintillation detector system 226 mounted on the support on the opposite side of the cylinder 220. The pattern of the x-ray source is generally disposed in the plane defined by the x-ray source 214 and the scintillation detector system 226.

The scintillation detector system 224 is typically narrow or thin in the direction perpendicular to the plane of the x-ray fan beam. Each cell 226 of the scintillation detector system incorporates a solid transparent bar of a scintillator material of this invention and a photodetector 222, e.g. a diode, optically coupled to that scintillator bar.

The output from each photodetector is generally connected to an operational amplifier which is mounted on the support 212. The output from each operational amplifier is connected either by individual wires 228 or by other electronics to the main control system 218 for the computed tomography (CT) system. In the illustrated embodiment, power for the x-ray source and signals from the scintillation detector are carried to the main control system 218 by a cable 216. The use of the cable 216 may limit the support 212 to a single full revolution before returning to its original position.

Alternatively, where continuous rotation of the support 212 is desired, slip rings or optical or radio transmission may be used to connect the support electronics to the main control system 218. In CT scanning systems of this type, the scintillator material is used to convert incident x-rays to luminescent light which is detected by the photodetector and thereby converted to an electrical signal as a means of converting the incident x-rays to electrical signals that can be processed for image extraction and other purposes.

Figure 3:
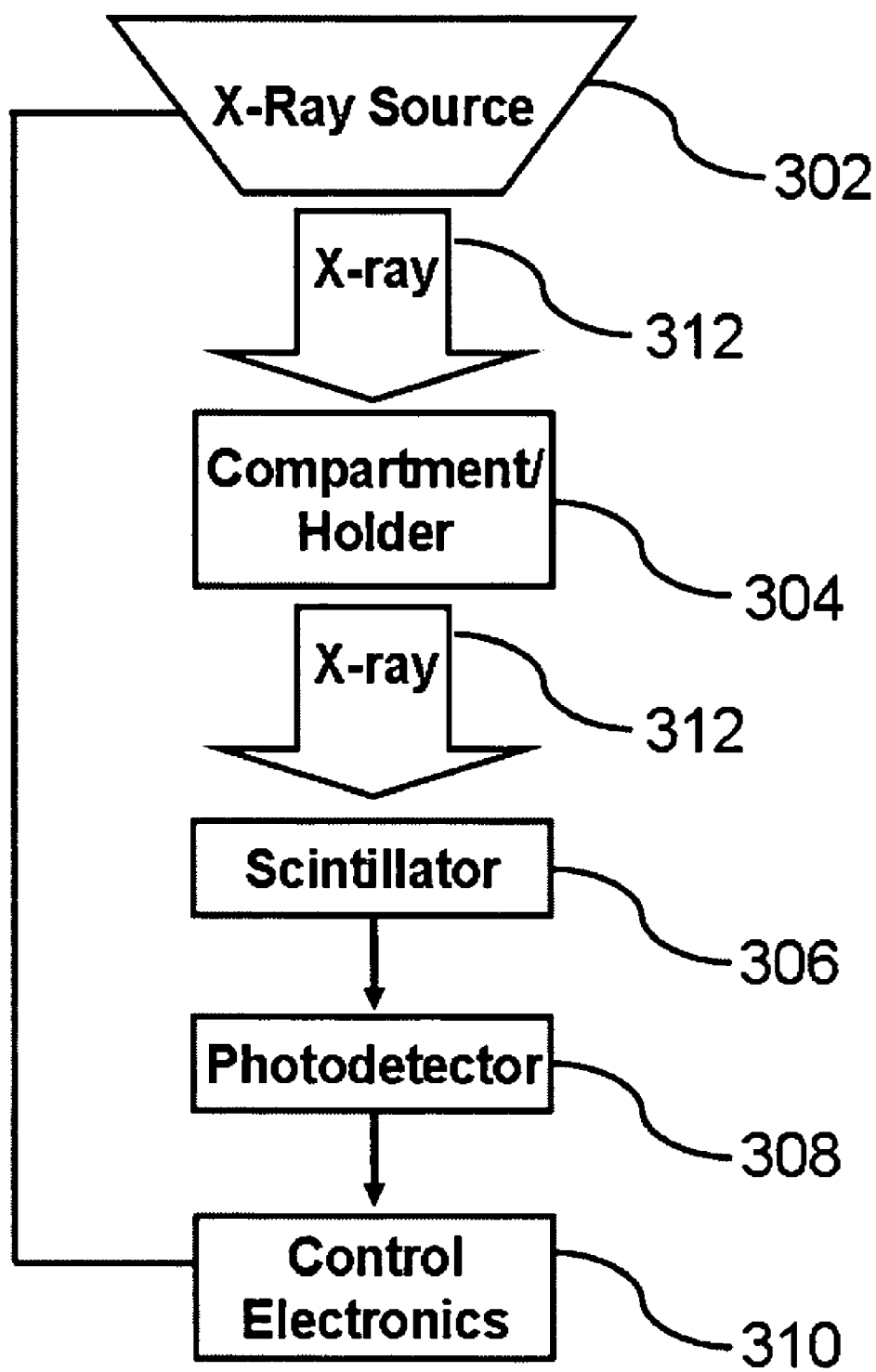

FIG. 3 schematically illustrates a a fast response x-ray detector system incorporating one or more of the scintillator materials of this invention. In certain embodiments, the x-ray detector system includes an x-ray scintillator material of this invention 306. The scintillator material 306 absorbs x-ray photons 312 and emits scintillating radiation which is detected by the scintillating radiation photodetector 308. The scintillating radiation photodetector 308 may be, for example, a photodiode, a photomultiplier, film, other solid state photo detectors, and the like. Preferably the response time of photodetector 308 is faster than the primary decay time of the scintillating radiation in the scintillator material 306 to take advantage of the short primary decay time of the scintillator material 306.

Typically the scintillator material 306 is optically coupled to the photodetector 308. The scintillator material 306 can be optically coupled to the photodetector 308 simply by positioning the scintillator material 306 physically adjacent to the photodetector 308. In certain embodiments, the scintillator material 306 can be optically coupled to the photodetector 308 by lens and/or mirrors and/or optical fiber(s) to focus the scintillating radiation upon the photodetector 308. In certain embodiments, the scintillator material 306 can be optically coupled to the photodetector 308 by means of optical fibers that transmit the scintillating radiation from the scintillator material 306 to the photodetector. Another alternative is to bond the scintillator material directly to the photodetector with an optical glue.

In certain embodiments, the photodetector 308 can be a single detector or it can comprise an array of detectors/detector elements. In the instance that the photodetector 308 is an array of detectors/detector elements, it is preferable that the scintillator material include some means of channeling the scintillating radiation from a region of the scintillator emitting scintillating radiation directly to the detector element directly underlying that region of the scintillator material. For instance, as with the embodiment of the invention of FIG. 2, the scintillator material can be made up of separate solid transparent bars. These bars can be coated with a material to prevent the scintillation radiation from passing between the bars.

The electronic signal output of the photodetector can ultimately be connected to control electronics 310. The electronic signal output may be amplified by a appropriate electronics, e.g., an operational amplifier (not shown), prior to being input to the control electronics. The control electronics 310 typically collects the output signal(s) from the photodetector(s) 308 corresponding to detection of scintillating radiation. The collected output signals can be further processed to produce an image corresponding to the detected x-rays as is well known in the art.

The x-ray detector system of this embodiment can also include an x-ray source 302 that directs x-rays 312 towards the scintillator material 306. However, it is not necessary that the x-ray detector system include an x-ray source 302. Instead, the x-ray source can be external to the x-ray detector system, or the x-rays may emanate from the object to be studied. For example, in x-ray detection applications such as astrophysics applications, x-rays may emanate from a body beyond the earth. If the x-ray detector system includes an x-ray source 302, the control electronics 310 can optionally include a power source for supplying power to the x-ray source.

The x-ray detector system can also include a compartment or holder 304 for holding an object to be studied. The compartment 304 is typically located between the x-ray source 302 and the scintillator material 306. The dimensions of the compartment/holder 304 will depend upon the particular application. For instance, an x-ray detector system for baggage inspection should be of a size to accommodate baggage, while an x-ray detector system for medical imaging should be of a size to accommodate a human being or animal.

In still another embodiment, this invention contemplates one or more light guides (optical fiber) optically coupled to a scintillator material of this invention. The signal produced by the scintillator material can be transmitted along the optical guide to one or more detector(s) as desired. In certain embodiments, a single optical guide is optically coupled to a scintillator material, while in other embodiments, multiple optical guides are optically coupled to a scintillator material. In the latter embodiment, it can be desirable for each optical guide to "sample" a discrete and independent region of the scintillator. In other embodiments, the optical guides may sample overlapping areas of the scintillator material.

The scintillator material can be optically coupled to the optical guide simply by positioning the scintillator material physically adjacent to the optical guide. In certain embodiments, the scintillator material can be optically coupled to the optical guide by lens and/or mirrors. Another alternative is to bond the scintillator material directly to the photodetector with an optical glue or to weld the scintillator material to the optical guide. In certain embodiments, the scintillator material can be fabricated as an integral component of the light guide. Methods of optically coupling the scintillator material to an optical guide (e.g., optical fiber) are well known to those of skill in the art (see, e.g., U.S. Pat. Nos. 6,504,156, 6,384,417, 5,558,815, 5,391,876, 5,386,797, 5,360,557, 5,318,722, and the like).

EXAMPLES

The following examples are offered to illustrate, but not to limit the claimed invention.

Example 1

Doped cadmium tungstates having the formulas $Cd_{0.9995}Na_{0.0005}WO_4$, $Cd_{0.9995}Gd_{0.0005}WO_4$, and $Cd_{0.999}(KBi)_{0.001}WO_4$ were fabricated were fabricated using conventional ceramic processing methods. Briefly, proper amounts of raw materials from $CdO$, $WO_3$, $Na_2CO_3$, $K_2CO_3$, $Gd_2O_3$, and $Bi_2O_3$ were selected according to the desired formula ($Cd_{0.9995}Na_{0.0005}WO_4$, $Cd_{0.9995}Gd_{0.0005}WO_4$, and $Cd_{0.999}(KBi)_{0.001}WO_4$). The compounds were wet-mixed together with ethanol alcohol to form a slurry. The slurry was dried at 100° C. for 2 hours. The mixture was then fired at 1100° C. for 3 hours in air.

The susceptibility to radiation damage of these materials was calculated based on the percentage change of scintillating peak intensity before and after X-ray exposure (145 KeV) for 5 hours. The distance between the samples and the x-ray source was 10 cm. After irradiation, the samples were immediately measured for luminescence properties immediately to eliminate any recovery effect.

Table 1 lists the light output before radiation and radiation damage of One $CdWO_4$ single crystal sample (milled to powder), one commercial $CdWO_4$ and the three different doped tungstates. Radiation damage was defined as the difference in light output before and after radiation divided by the light output before radiation.

Table 1. light output and radiation damage data of various $CdWO_4$ powder samples.

| Sample | Peak value (no rad.) | Radiation damage |
| --- | --- | --- |
| Single Crystal | 888 | 37.5% |
| Polycrystalline Powder | 342 | 30% |
| $Cd_{0.9995}Na_{0.0005}WO_4$ | 416 | 13.1% |
| $Cd_{0.9995}Gd_{0.0005}WO_4$ | 414 | 2.2% |
| $Cd_{0.999}(KBi)_{0.001}WO_4$ | 571 | 6.8% |

The doped samples were sintered at 1000° C. for 3 hours.

Emission spectra of the powdered samples before and after irradiation were determined by exciting the sample with an X-ray source having peak energy of 8 keV produced from a copper anode at a power of 40 kV and 20 mA. Since all emission spectra of all of the samples had almost the same peak position and shape, we used peak height as the measure of light output.

Usually the radiation damage of scintillator crystals is measured from the change of transmittance of visible light before and after irradiation. Powder samples, however, are not transparent and thus this method is not feasible.

The high intensity radiation caused defects in crystal structure, and these defects trap the visible light excited by X-ray. Consequently the radiation damage lowers the light output of the scintillator materials. Therefore, the radiation damage can also be measured by the change of light output of the scintillator(s) (when exposed to a defined energy source) before and after irradiation. From the data in table 1, the radiation damage, up to 37.5% for the single crystal powder sample, was consistent with the data measured by transmission method, indicates that the data presented in the Table is a valid measure of radiation damage.

The light output of crystal samples was much higher than the other powder samples indicating that the radiation-induced defects in the in single crystals was less than the powder samples. The light output of all of the doped samples was greater than the commercial $CdWO_4$ powder sample indicating that the doping reduced radiation damage.

As shown in Table 1, $Gd^{3+}$ doping was the most effective. Co-doping of $K^{1+}$ and $Bi^{3+}$ was better than single $Na^{1+}$ doping. Without being bound to a particular theory, it is believed the doping of trivalent ions can introduce excess oxygen ions to the crystal lattice, which later supplements the oxygen vacancy caused by radiation and thereby reduces the radiation damage. In conclusion, the doping described herein, especially trivalent ion doping of $CdWO_4$ improves the radiation hardness of the tungstate scintillator while maintaining the scintillator light output and other desirable properties.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A sintered body comprising a scintillator composition comprising a cadmium tungstate doped with a monovalent metal ion and/or a trivalent metal ion, the scintillator composition being a component of the sintered body, wherein said scintillator composition shows higher radiation tolerance than undoped $CdWO_4$.

2. The sintered body of claim 1, wherein the doped cadmium tungstate is represented by the formula:

$$Cd_{(1-(x+y))}A_xB_yWO_4$$

where:
A is a monovalent metal ion selected from the group consisting of Li, Na, K, Rb, Cs, Ag, Tl, and combinations thereof;
B is a trivalent metal ion selected from the group consisting of Bi, Y, La, Ce, Pr, Nd, Gd, Pm, Sm, Eu, Tb, Dy, Ho, Er, Tm, Yb, Lu, and combinations thereof;
X ranges from 0 to about 0.01;
Y ranges from 0 to about 0.01; and
at least one of X or Y is non-zero.

3. A scintillator composition comprising a cadmium tungstate doped with a monovalent metal ion and/or a trivalent metal ion, wherein said scintillator composition shows higher radiation tolerance than undoped $CdWO_4$; and,
wherein the doped cadmium tungstate is represented by the formula:
$$Cd_{(1-(x+y))}A_xB_yWO_4$$
where:
A is a monovalent metal ion selected from the group consisting of: Li, Na, K, Rb, Cs, Ag, Tl, and combinations thereof;
B is a trivalent metal ion selected from the group consisting of: Bi, Y, La, Ce, Pr, Nd, Gd, Pm, Sm, Eu, Tb, Dy, Ho, Er, Tm, Yb, Lu, and combinations thereof;
wherein X is about 0.005; and,
Y ranges from 0 to about 0.01.

4. A scintillator composition comprising a cadmium tungstate doped with a monovalent metal ion and/or a trivalent metal ion, wherein said scintillator composition shows higher radiation tolerance than undoped $CdWO_4$; and,
wherein the doped cadmium tungstate is represented by the formula:
$$Cd_{(1-(x+y))}A_xB_yWO_4$$
where:
A is a monovalent metal ion selected from the group consisting of: Li, Na, K, Rb, Cs, Ag, Tl, and combinations thereof;
B is a trivalent metal ion selected from the group consisting of: Bi, Y, La, Ce, Pr, Nd, Gd, Pm, Sm, Eu, Tb, Dy, Ho, Er, Tm, Yb, Lu, and combinations thereof;
wherein X is about 0.001; and
Y ranges from 0 to about 0.01.

5. A scintillator composition comprising a cadmium tungstate doped with a monovalent metal ion and/or a trivalent metal ion, wherein said scintillator composition shows higher radiation tolerance than undoped $CdWO_4$; and,
wherein the doped cadmium tungstate is represented by the formula:
$$Cd_{(1-(x+y))}A_xB_yWO_4$$
where:
A is a monovalent metal ion selected from the group consisting of: Li, Na, K, Rb, Cs, Ag, Tl, and combinations thereof;
B is a trivalent metal ion selected from the group consisting of: Bi, Y, La, Ce, Pr, Nd, Gd, Pm, Sm, Eu, Tb, Dy, Ho, Er, Tm, Yb, Lu, and combinations thereof;
wherein X is about 0.001 or about 0.005; and,
wherein Y is 0.

6. The sintered body of claim 2, wherein Y is about 0.005.

7. The sintered body of claim 2, wherein Y is about 0.001.

8. The sintered body of claim 6, wherein X is 0.

9. The sintered body of claim 7, wherein X is 0.

10. The sintered body of claim 2, wherein X is zero, and Y is greater than zero.

11. The sintered body of claim 10, wherein B is $Gd^{3+}$.

12. A scintillator composition comprising a cadmium tungstate doped with a monovalent metal ion and/or a trivalent metal ion, wherein said scintillator composition shows higher radiation tolerance than undoped $CdWO_4$; and,
wherein the doped cadmium tungstate is represented by the formula:
$$Cd_{(1-(x+y))}A_xB_yWO_4$$
where:
A is a monovalent metal ion selected from the group consisting of: Li, Na, K, Rb, Cs, Ag, Tl, and combinations thereof;
wherein X ranges from 0 to about 0.01; and,
B is $Gd^{3+}$ and Y ranges from about 0.0002 to about 0.001.

13. A scintillator composition comprising a cadmium tungstate doped with a monovalent metal ion and/or a trivalent metal ion, wherein said scintillator composition shows higher radiation tolerance than undoped $CdWO_4$; and,
wherein the doped cadmium tungstate is represented by the formula:
$$Cd_{(1-(x+y))}A_xB_yWO_4$$
where:
A is a monovalent metal ion selected from the group consisting of: Li, Na, K, Rb, Cs, Ag, Tl, and combinations thereof;
B is a trivalent metal ion selected from the group consisting of: Bi, Y, La, Ce, Pr, Nd, Gd, Pm, Sm, Eu, Tb, Dy, Ho, Er, Tm, Yb, Lu, and combinations thereof;
wherein X and Y are both 0.01 or less; and,
wherein X and Y are both greater than zero.

14. The scintillator composition of claim 13, wherein A is $K^{1+}$ or $Rb^{1+}$ and B is $Bi^{3+}$.

15. A scintillator composition comprising a cadmium tungstate doped with a monovalent metal ion and/or a trivalent metal ion, wherein said scintillator composition shows higher radiation tolerance than undoped $CdWO_4$; and, wherein the doped cadmium tungstate is represented by the formula:

$Cd_{(1-(x+y))}A_xB_yWO_4$ where:

A is a monovalent metal ion selected from the group consisting of: Li, Na, K, Rb, Cs, Ag, Tl, and combinations thereof;

B is a trivalent metal ion selected from the group consisting of: Bi, Y, La, Ce, Pr, Nd, Gd, Pm, Sm, Eu, Tb, Dy, Ho, Er, Tm, Yb, Lu, and combinations thereof;

wherein X ranges from greater than zero to about 0.01, and Y is zero.

16. A scintillator composition comprising a cadmium tungstate doped with a monovalent metal ion and/or a trivalent metal ion, wherein said scintillator composition shows higher radiation tolerance than undoped $CdWO_4$; and, wherein the doped cadmium tungstate is represented by the formula:

$Cd_{(1-(x+y))}A_xB_yWO_4$ where:

A is a monovalent metal ion selected from the group consisting of: Na, K and combinations thereof;

B is a trivalent metal ion selected from the group consisting of: Bi, Gd, and combinations thereof;

wherein said doped cadmium tungstate is selected from the group consisting of $Cd_{0.9995}Na_{0.0005}WO_4$, $Cd_{0.9995}Gd_{0.0005}WO_4$, and $Cd_{0.999}(KBi)_{0.001}WO_4$.

17. A detector element of an X-ray CT scanner comprising a scintillator composition of any one of claims 1 through 16.

18. An x-ray detector comprising:

a scintillator composition of any one of claims 1 through 16; and a photodetector disposed to detect light emitted by said scintillator composition.

19. The detector of claim 18, wherein said photodetector is selected from the group consisting of a photomultiplier, a photodiode, and photographic-film.

20. A method of producing an X-ray image, said method comprising:

providing an x-ray detector comprising a scintillator composition of any one of claims 1 through 16;

subjecting said scintillator composition to X-ray radiation; and detecting light emission from said scintillator composition.

* * * * *